(12) United States Patent
Sinitsky et al.

(10) Patent No.: US 9,048,821 B2
(45) Date of Patent: Jun. 2, 2015

(54) LOW POWER RELAXATION OSCILLATOR

(71) Applicants: Dennis Sinitsky, Austin, TX (US);
Praveen Kallam, Austin, TX (US)

(72) Inventors: Dennis Sinitsky, Austin, TX (US);
Praveen Kallam, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 13/923,297

(22) Filed: Jun. 20, 2013

(65) Prior Publication Data
US 2014/0375392 A1 Dec. 25, 2014

(51) Int. Cl.
*H03K 3/02* (2006.01)
*H03K 3/0231* (2006.01)

(52) U.S. Cl.
CPC .................. *H03K 3/0231* (2013.01)

(58) Field of Classification Search
USPC ................................. 331/111, 143
See application file for complete search history.

(56) References Cited

U.S. PATENT DOCUMENTS

| | | | |
|---|---|---|---|
| 5,184,094 A | 2/1993 | Kohler | |
| 7,102,452 B1 * | 9/2006 | Holmes | 331/111 |
| 8,350,631 B1 | 1/2013 | Wadhwa et al. | |
| 2007/0103243 A1 * | 5/2007 | Gong | 331/111 |
| 2011/0095832 A1 | 4/2011 | Fedan | |
| 2012/0319789 A1 | 12/2012 | Bhowmik et al. | |

FOREIGN PATENT DOCUMENTS

EP 0296668 B1 2/1992

OTHER PUBLICATIONS

De Vita, Giuseppe; Marraccini, Francesco; and Iannaccone, Giuseppe, Low-Voltage Low-Power CMOS Oscillator with Low Temperature and Process Sensitivity, IEEE International Symposium on Circuits and Systems, 2007. ISCAS 2007, May 27-30, 2007, pp. 2152-2155, New Orleans, LA.

* cited by examiner

*Primary Examiner* — Joseph Chang
(74) *Attorney, Agent, or Firm* — Cesari & Reed LLP; R. Michael Reed

(57) ABSTRACT

A relaxation oscillator circuit includes a comparator including a first input, a second input, a bias input, and an output. The first input is coupled to a charging node, and the second input is configured to receive a reference voltage. The relaxation oscillator circuit further includes a first bias circuit configured to provide a bias signal to the bias input of the first comparator when a first node voltage on the charging node exceeds a first reference.

18 Claims, 7 Drawing Sheets

US 9,048,821 B2

LOW POWER RELAXATION OSCILLATOR

FIELD

The present disclosure is generally related to oscillator circuits, and more particularly to relaxation oscillators.

BACKGROUND

Relaxation oscillators are used in a variety of electronic systems, including radio, telecommunications, computers, and other electronics that utilize clock signals. In an example, oscillator signals may be used to provide a clock reference for a low-power system. In an example, a relaxation oscillator can include a resistor-capacitor (RC) circuit, and may generate an oscillating signal by charging and discharging the capacitor through the RC circuit and by comparing voltage across the capacitor to a reference voltage.

SUMMARY

In an embodiment, a relaxation oscillator circuit includes a comparator including a first input, a second input, a bias input, and an output. The first input is coupled to a charging node, and the second input is configured to receive a reference voltage. The relaxation oscillator circuit further includes a first bias circuit configured to provide a bias signal to the bias input of the first comparator when a first node voltage on the charging node exceeds a first reference.

In another embodiment, a method of providing an oscillator signal, which has a period that includes a first portion and a second portion, includes receiving a first signal at a bias input of a first comparator of an oscillator circuit during the first portion of the period of the oscillator signal. The method further includes receiving a bias signal at the bias input during the second portion of the period of the oscillator signal.

In still another embodiment, a relaxation oscillator circuit includes a first comparator and a first bias circuit. The first comparator includes a first input, a second input, a bias input, and an output. The first input is coupled to a first charging node, and the second input is coupled to a reference voltage. The bias input receives a first bias signal during a first portion of a period of oscillation. The first bias circuit is coupled to the bias input and to the first charging node. The first bias circuit is configured to provide a second bias signal to the bias input during a second portion of the period of oscillation.

BRIEF DESCRIPTION OF THE DRAWINGS

In the following discussion, the same reference numbers are used in the various embodiments to indicate the same or similar elements.

DETAILED DESCRIPTION OF ILLUSTRATIVE EMBODIMENTS

In the following detailed description of the embodiments, reference is made to the accompanying drawings which form a part hereof, and in which are shown by way of illustration of example embodiments. It is to be understood that features of the various described embodiments and examples may be combined, other embodiments may be utilized, and structural changes may be made without departing from the scope of the present disclosure.

Embodiments of an oscillator circuit that includes a bias circuit (or boost bias circuit) configured to selectively increase a supply voltage to a comparator when the voltage at the input node crosses a boost threshold. The increased power improves the speed of the comparator (relative to the comparator operating in a low power or idle mode) as the charge at the input node approaches a reference voltage level, which is greater than the boost threshold. This allows the relaxation oscillator to operate in a reduced power mode for a large portion of the period of oscillation, and to transition to a higher power, faster operating mode for a brief period just before the voltage at the input node reaches a reference voltage level. This technique provides a stable frequency output that maybe less than plus or minus one percent without factory trimming of temperature coefficients, thereby reducing factory costs associated with testing at multiple temperatures during manufacturing. Further, the technique produces a clock signal with reduced clock jitter due to lower 1/f noise as compared to conventional relaxation oscillator circuits. One embodiment of a relaxation oscillator according to an embodiment is described below with respect to FIG. 1.

Figure 1:
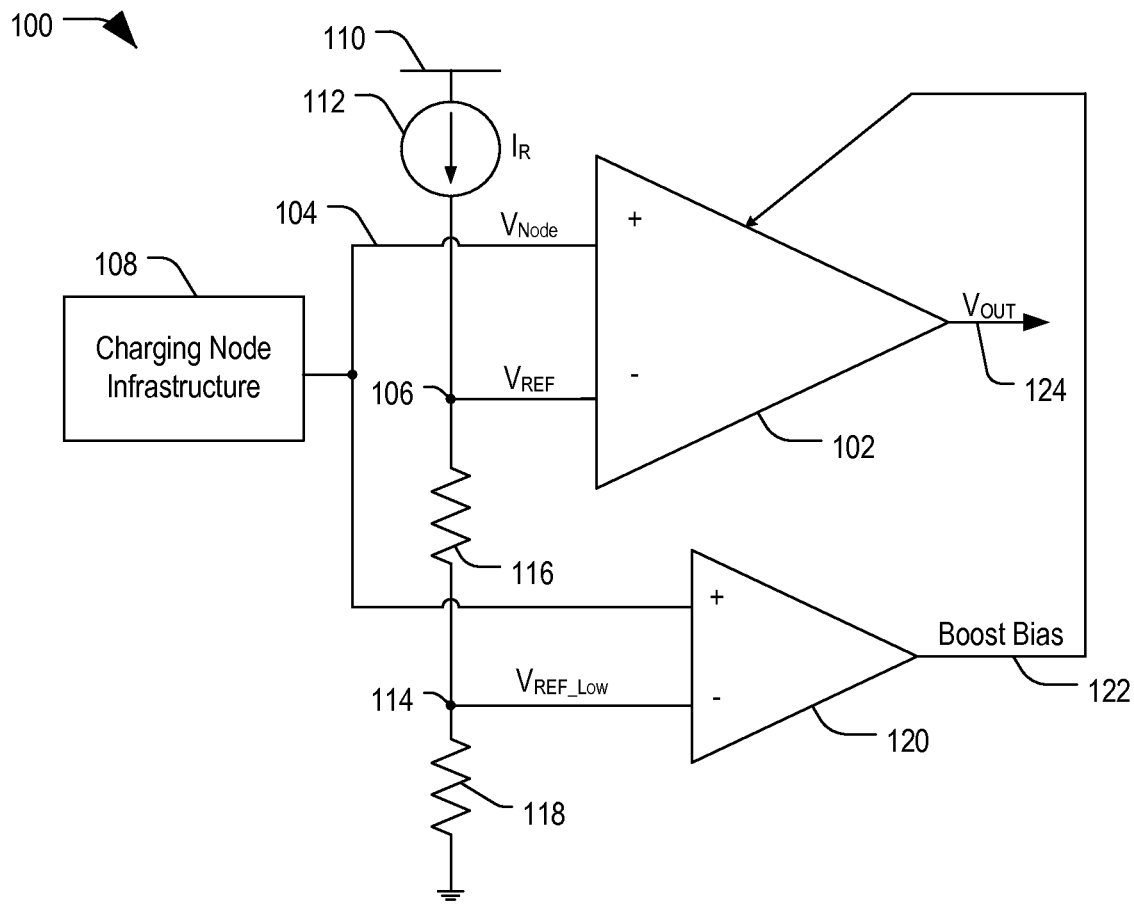
FIG. 1 is a diagram of a relaxation oscillator circuit including an auxiliary comparator according to an embodiment.

FIG. 1 is a diagram of a relaxation oscillator circuit 100 including an auxiliary comparator 120 according to an embodiment. Relaxation oscillator circuit 100 includes a comparator 102 including a first input coupled to a node 104 to receive a node voltage (labeled "$V_{Node}$"), a second input coupled to a node 106 to receive a reference voltage (labeled "$V_{REF}$"), and an output 124 to provide an output voltage (labeled "$V_{out}$"). Circuit 100 further includes a reference current source 112 coupled between a supply node 110 and node 106. Circuit 100 further includes a resistor 116 coupled between node 106 and a node 114, and includes a resistor 118 coupled between node 114 and a supply node, such as ground. Auxiliary comparator 120 operates as a boost bias circuit in this example. Auxiliary comparator 120 includes a first input coupled to node 104, a second input coupled to node 114, and an output 122 coupled to a supply input of comparator 102.

Node 104 is coupled to a charging node infrastructure 108. Charging node infrastructure 108 is drawn for simplicity of discussion, but should be understood to include charging capacitors, related switches driven by clock signals, and a current source, as depicted, for example, in FIGS. 6 and 7. Further, the output 124 of comparator 102 may be coupled to a clock divider circuit and an inverter block to provide the output signal, as depicted in FIG. 7.

In an example, charging node infrastructure 108 selectively charges a first capacitor and a second capacitor and selectively supplies the corresponding voltages to node 104. Comparator 102 compares the node voltage ($V_{Node}$) at node 104

(which corresponds to a voltage on a plate of a capacitor) to a reference voltage ($V_{REF}$) on node 106 and produces an output signal ($V_{OUT}$) on output 124 that transitions to a logic high level when the node voltage exceeds the reference voltage.

Omitting operation of auxiliary capacitor 120 for the moment, the voltage on the capacitor at node 104 relates to the reference voltage as follows:

$$V_{Node} = \frac{I_C \frac{T}{2}}{C} = V_{REF} = I_{112} R_{116+118}, \quad (1)$$

where $I_C$ represents a charging current within charging node infrastructure 108 and the variable C represents a first capacitor (CR) and a second capacitor (CL) which are substantially equal (i.e., C=CR=CL). In Equation 1, the variable T represents a period of oscillation, which is divided by 2 to represent the switching between first and second capacitors (CR and CL), which may be charged during different portions of the period of oscillation. Further, the resistance ($R_{116+118}$) represents the series resistance of resistors 116 and 118.

Equation 1 may be rewritten as shown below:

$$T = 2 \frac{I_{112}}{I_C} R_{116+118} C, \quad (2)$$

In Equation 2, the currents $I_{112}$ and $I_C$ may be ratio metric, such that the ratio is temperature-independent. The capacitance C may be a metal capacitance, which is independent of temperature, and the resistance (R) may be chosen to be temperature-independent. Therefore, the period of oscillation may be temperature independent. However, each comparator, such as comparator 102, has finite response time, and the period of oscillation (T) includes a comparator delay ($T_d$). Thus, even if the oscillator frequency can be calibrated to cancel offsets, such calibration typically is performed at a single temperature, and the comparator delay may vary with the effects of temperature, causing temperature-induced variation in the oscillation period.

However, temperature variation of the comparator delay may be reduced if the comparator delay itself is reduced. One way to reduce the comparator delay is to increase power to the comparator 102, reducing the reaction time of the comparator 102. In the illustrated embodiment, auxiliary comparator 120 is configured to selectively increase the power supplied to comparator 102 to improve the delay time without sacrificing power dissipation. By increasing the power to comparator 102 during a portion of the period of oscillation when the node voltage ($V_{Node}$) at node 104 is approaching the level of the reference voltage ($V_{REF}$) at node 106, i.e., when comparator 102 is about to detect the node voltage crossing the reference voltage, the comparator 102 may be readied to react quickly to the node voltage ($V_{Node}$) crossing the reference voltage ($V_{REF}$). When the node voltage ($V_{Node}$) at node 104 is close to zero, the speed of comparator 102 is irrelevant because the output ($V_{OUT}$) of comparator 102 is not changing during this time so the boost bias circuit (comparator 120) is configured to provide the boost bias when the node voltage ($V_{Node}$) is close to the reference voltage level.

In the illustrated embodiment, resistors 116 and 118 provide a voltage divider circuit. Resistor 118 is typically larger than resistor 116. In a particular example, resistor 118 provides approximately ninety percent of the series resistance ($R_{116+118}$) of resistors 116 and 118 together, such that the voltage (labeled "$V_{REF\_Low}$") at node 114 is about ten percent lower than the reference voltage ($V_{REF}$) at node 104 by a selected percentage. In another embodiment, a different ratio may also be selected to adjust the amount of time between application of the boost bias and the node voltage ($V_{Node}$) crossing the reference voltage ($V_{REF}$).

In an embodiment, while the node voltage ($V_{Node}$) on node 104 is below the low reference voltage ($V_{REF\_Low}$), comparator 102 operates in a low power, slow operating mode. In one embodiment, comparator 102 may be powered down altogether. Once the node voltage ($V_{Node}$) exceeds the low reference voltage ($V_{REF\_Low}$) comparator 120 toggles, producing a signal (labeled "Boost Bias") on output 122, supplying a higher power level to and activating a "high-speed" mode of comparator 102. Thus, by the time the node voltage ($V_{Node}$) at node 104 reaches the level of the reference voltage ($V_{REF}$) at node 106, comparator 102 is in a high-speed mode and can react quickly to toggle right away.

In an example that uses a low-power design, auxiliary comparator 120 can dissipate 2 nA of current, and comparator 102 may dissipate 1.9 nA of current in a sleep mode. In the high speed mode, auxiliary comparator 120 continues to dissipate 2 nA of current, while comparator 102 dissipates 100 nA of current. The relative sizes of resistors 116 and 118 may be selected to increase or reduce the amount of time during which the current dissipation is increased. For example, in an embodiment where the resistor 118 supplies approximately ninety percent of the series resistance and resistor 116 supplies the other ten percent, relaxation oscillator circuit 100 applies the boost bias when the node voltage ($V_{Node}$) is within about ten percent of the reference voltage ($V_{REF}$), using the high-speed mode for approximately ten percent of the overall duty cycle. In this example, the total current dissipation may be determined according to the following equation:

$$I_{TOTAL} = 2 \text{ nA} + 100 \text{ nA} + 90\% * 1.9 \text{ nA} = 13.8 \text{ nA} \quad (3)$$

Thus, by utilizing a low-power auxiliary comparator 120 to selectively alter power supplied to comparator 102, overall power consumption may be kept low without increasing the comparator delay.

In an example, the period of time during which the boost bias is applied to comparator 102 is a function of the relative sizing of resistors 116 and 118 and delay of auxiliary comparator 120. In particular, the difference in the resistances determines the voltage ratio, determining when comparator 120 turns on relative to when comparator 102 will toggle. One example of a timing diagram that depicts the relative duration of the boost bias is described below with respect to FIG. 2.

Figure 2:
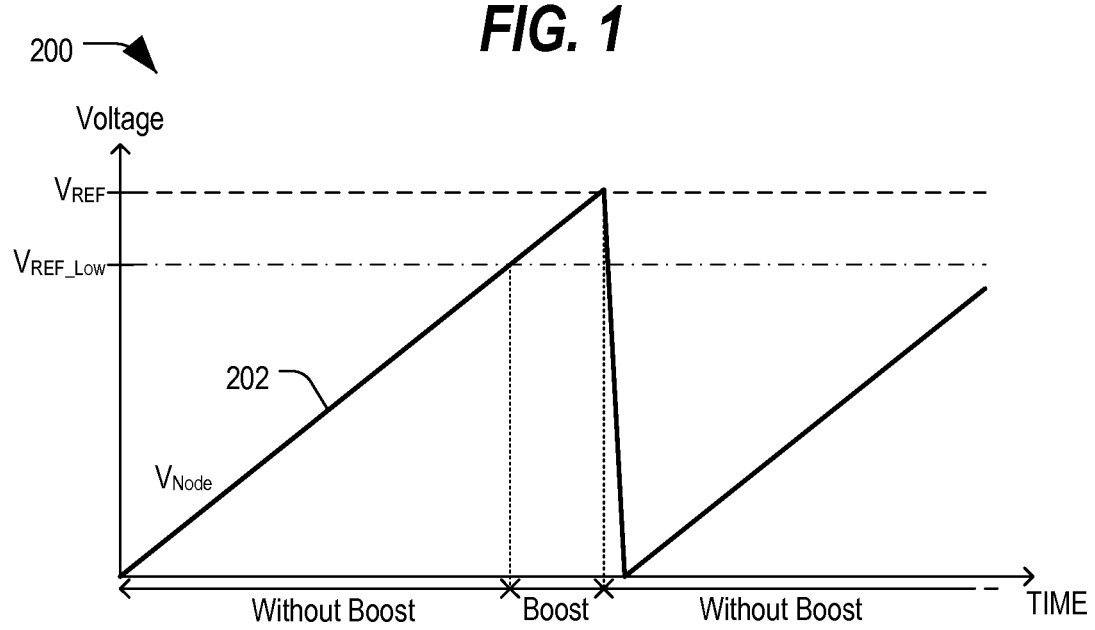
FIG. 2 is a timing diagram depicting timing of charging of an input node relative to two different thresholds according to an embodiment of the relaxation oscillator circuit of FIG. 1.

FIG. 2 is a timing diagram 200 depicting timing of charging of an input node relative to two different thresholds according to an embodiment of the relaxation oscillator circuit 100 of FIG. 1. Timing diagram 200 includes the node voltage ($V_{Node}$) 202, which is the voltage at node 104 in FIG. 1. The node voltage 202 increases linearly, crossing the low reference voltage ($V_{REF\_LOW}$) which is on node 114 first, then crossing the reference voltage ($V_{REF}$) which is on node 106 in FIG. 1. When the node voltage 202 crosses the low reference voltage ($V_{REF\_LOW}$), the boost bias is applied to the supply input of comparator 102, enhancing the response time of comparator 102. When the node voltage 202 crosses the reference voltage ($V_{REF}$), the boost bias is turned off and the voltage at charging node 104 is reset, restarting the charging process.

In the illustrated example of FIG. 2, the boost bias time is substantially less than the periods of time without the boost bias. The difference between the reference voltage ($V_{REF}$) and the low reference voltage ($V_{REF\_LOW}$) determines the relative timing. In some examples, the relative resistances of resistors 116 and 118 may be selected to correspond to a period of time to transition comparator 102 from a low-power mode into a high-speed mode. An example of the timing provided by relaxation oscillator circuit 100 is described below with respect to FIG. 3.

Figure 3:
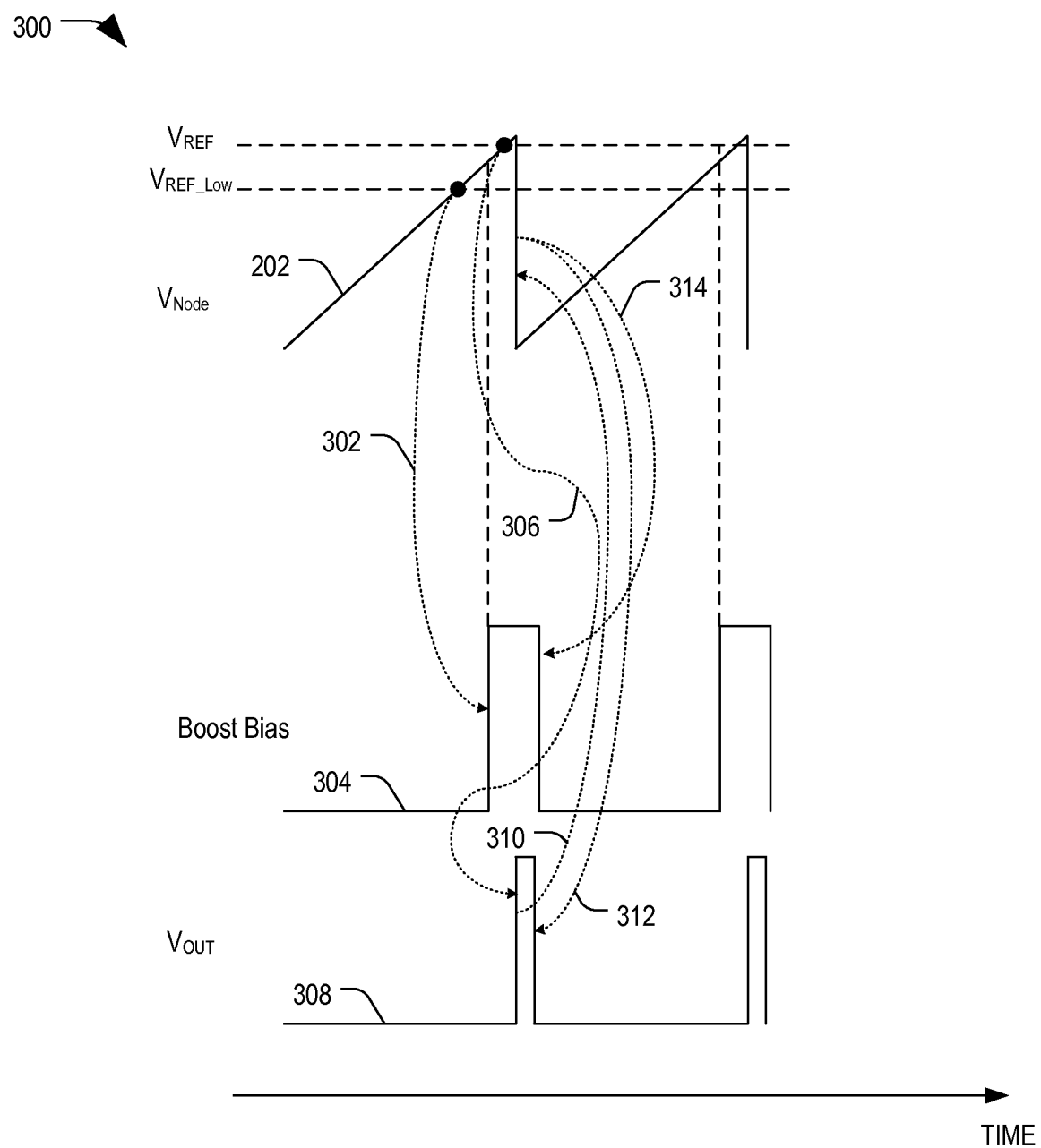
FIG. 3 is a second timing diagram depicting timing of various signals of the relaxation oscillator circuit of FIG. 1.

FIG. 3 is a second timing diagram 300 depicting timing of various signals of the relaxation oscillator circuit 100 of FIG. 1. Diagram 300 includes the node voltage ($V_{Node}$) 202, boost bias signal 304, and the comparator output signal ($V_{OUT}$) 308. The node voltage ($V_{Node}$) 202 increases as a linear ramp. When the node voltage ($V_{Node}$) 202 crosses the low reference voltage ($V_{REF\_LOW}$), auxiliary comparator 120 issues the boost bias signal on line 122 to comparator 102, as indicated by dashed line 302. After the node voltage ($V_{Node}$) 202 crosses the reference voltage ($V_{REF}$) comparator 102 toggles, as indicated by dashed line 306. The comparator toggling causes the node voltage ($V_{Node}$) 202, which is at capacitor charging node 104 in FIG. 1, to switch to a new capacitor voltage at zero volts, which is indicated by dashed line 310. Since the charging node voltage ($V_{Node}$) 202 toggles to zero, comparator 102 and auxiliary comparator 120 toggle again, which toggling is represented by dashed lines 312 and 314. The delay represented by dashed line 302 (time from $V_{REF\_Low}$ crossing to auxiliary comparator 120 toggling, i.e., boost bias signal 304 transitioning to a logic high level) is substantially larger than the time delay represented by dashed line 306 (time from $V_{REF}$ crossing to comparator 102 toggling). This difference in the delays represents operation of the comparator 102 with the boost bias signal applied as compared to the delay when operating in a low-power mode.

In the example, the boost bias signal 308 is applied from a period just before the node voltage 202 crosses the reference voltage ($V_{REF}$) until some period of time after the crossing. However, once the crossing of the reference voltage is detected, the boost bias signal could be reduced, because the sensitivity and speed of comparator 102 becomes less relevant after comparator 102 toggles. One example circuit to enhance the power savings by reducing the amount of time during which the boost bias is applied (i.e. reducing a boost bias pulse width) is described below with respect to FIG. 4.

Figure 4:
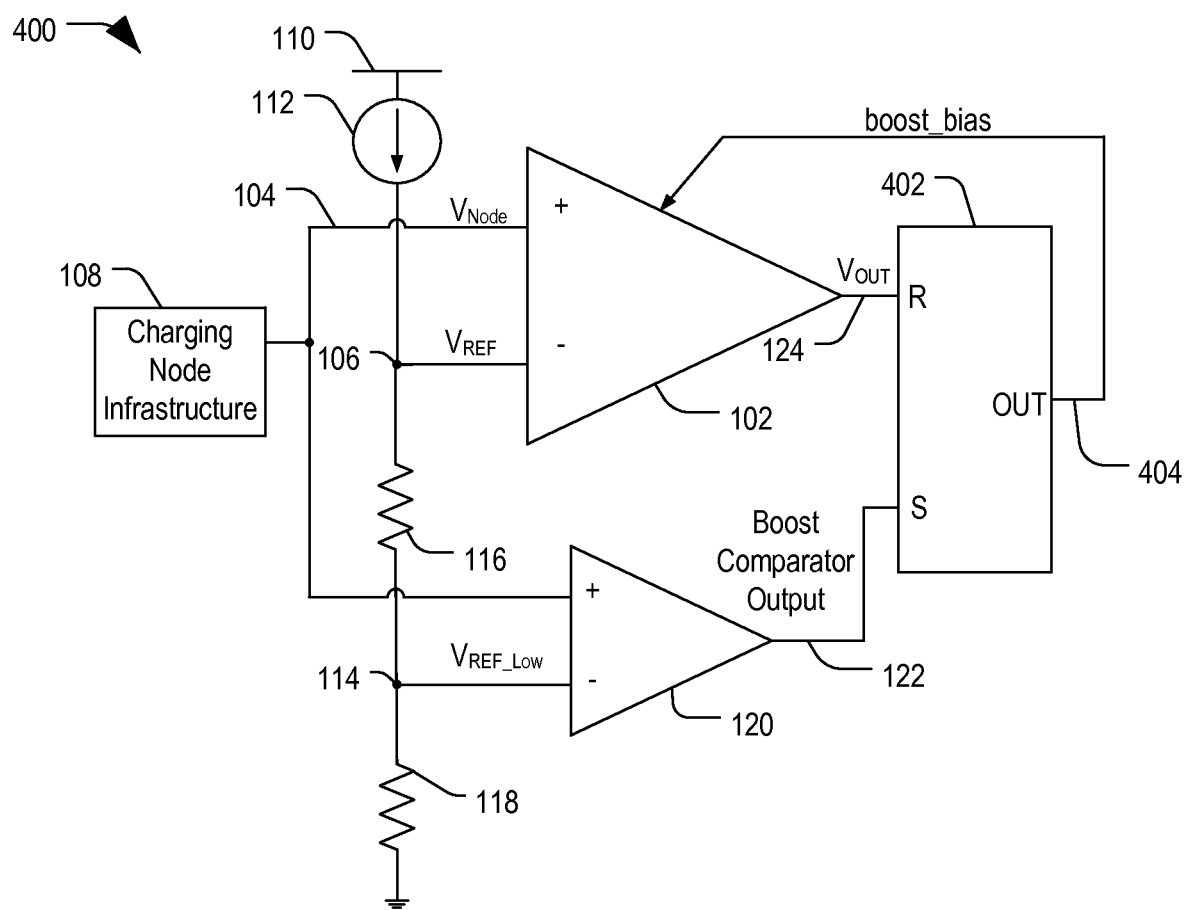
FIG. 4 is a diagram of a relaxation oscillator circuit including an auxiliary comparator according to a second embodiment.

FIG. 4 is a diagram of a relaxation oscillator circuit 400 including an auxiliary comparator 120 according to a second embodiment. In addition to all of the elements of circuit 100 of FIG. 1, circuit 400 further includes a set-reset (SR) latch 402, which has a first input coupled to output 122 of comparator 120 and a second input coupled to output 124 of comparator 102. SR Latch 402 includes an output 404 coupled to the bias input of comparator 102 to provide the bias signal.

Circuit 400 uses slightly less power than circuit 100 of FIG. 1. In particular, since the logic-low to logic-high toggling speed of comparator 102 is of priority, the SR latch 402 is inserted in the signal path of the boost bias generation. Since the outputs of comparator 102 and comparator 120 transition from low-to-high and high-to-low based on the results of the comparisons, the output transitions are similar to digital pulses, which provide transition edges to toggle the SR latch 402. In the illustrated example, auxiliary comparator 120 sets the latch output causing the output of SR latch 402 to transition from low-to-high to provide the boost bias, and the rising edge of the output of comparator 102 rests the latch so that comparator 102 returns to the slow, low-current mode after the node voltage ($V_{Node}$) exceeds the reference voltage ($V_{REF}$). In an alternative embodiment, comparator 102 could be configured to set the latch output and comparator 120 could be configured to reset the latch output. In some embodiments, SR latch 402 may include an additional delay from the reset input (R) to the output 304 to allow analog signals within comparator 102 to settle and to prevent glitches.

Since the boost bias signal is not gated by a slow comparator high-to-low transition, the boost bias signal pulse may be more tightly tied to the output of comparator 102, making the boost bias signal pulse shorter in duration, thus saving more current. One example of a timing diagram of relaxation oscillator circuit 400 is described below with respect to FIG. 5.

Figure 5:
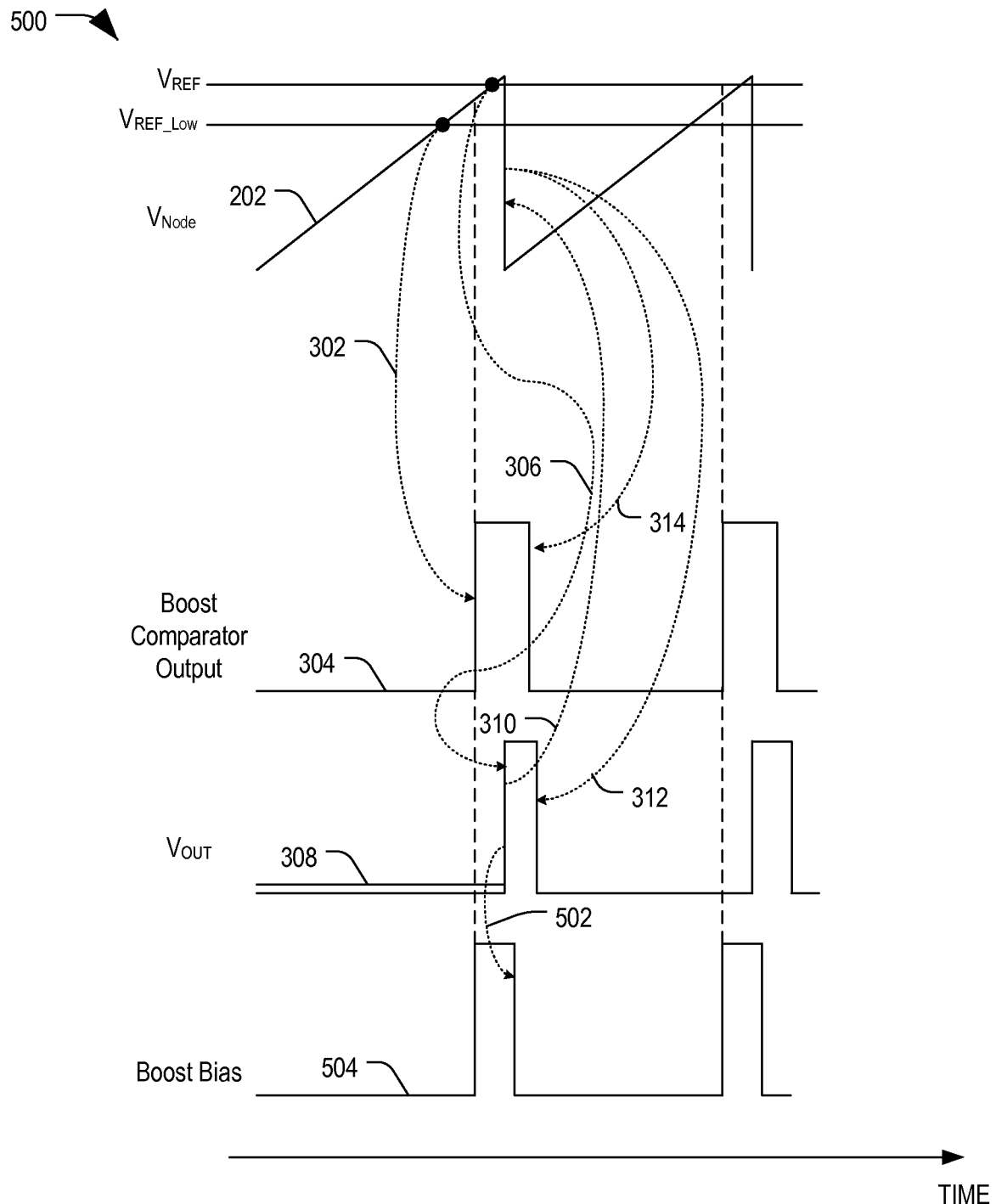
FIG. 5 is a timing diagram of various signals of the relaxation oscillator circuit of FIG. 4.

FIG. 5 is a timing diagram 500 of various signals of the relaxation oscillator circuit of FIG. 4. Diagram 500 includes node voltage 202, boost comparator output 304, output voltage ($V_{OUT}$), and the boost bias signal 504 at the output 404 of SR latch 402 in FIG. 4. The node voltage 202 increases as a linear ramp. When the node voltage 202 crosses the low reference voltage ($V_{REF\_LOW}$), auxiliary comparator 120 issues the boost bias signal on line 122 to comparator 102, as indicated by dashed line 302. After the node voltage ($V_{Node}$) crosses the reference voltage ($V_{REF}$) comparator 102 toggles, as indicated by dashed line 306. The comparator toggling causes the node voltage ($V_{Node}$), which is at capacitor charging node 104 in FIG. 1, to switch to a new capacitor voltage at zero volts, which is indicated by dashed line 310. Since the charging node toggles to zero, the outputs of comparator 102 and auxiliary comparator 120 toggle again, which toggling is represented by dashed lines 312 and 314. The delay of dashed line 302 (time from $V_{REF\_Low}$ crossing to auxiliary comparator 120 toggling, i.e., boost bias signal 304 transitioning to a logic high level) is substantially larger than the time delay represented by dashed line 306 (time from $V_{REF}$ crossing to comparator 102 toggling). This difference in the delays represents operation of the comparator 102 with the boost bias signal applied as compared to comparator 120 being low-power.

Further, the width of the pulse of boost bias signal 504 is equal to the speed of the response of comparator 102 the node voltage ($V_{Node}$) exceeding the reference voltage ($V_{REF}$) plus the reset-to-output delay of SR latch 402, represented by dashed line 502. In particular, as the output voltage 308 of comparator 102 transitions from a low-to-high level, the SR latch 402 is reset, such that the output signal on output 404 transitions from high-to-low, reducing the boost bias applied to comparator 102.

It should be appreciated that, though the above-discussion has been directed to a single comparator 102 and a single auxiliary comparator 120 to provide a boost bias to the comparator 102, the concept may be generalized to a two-comparator architecture while still providing power savings. One example of a relaxation oscillator circuit that includes two comparators and two auxiliary comparators is described below with respect to FIG. 6.

Figure 6:
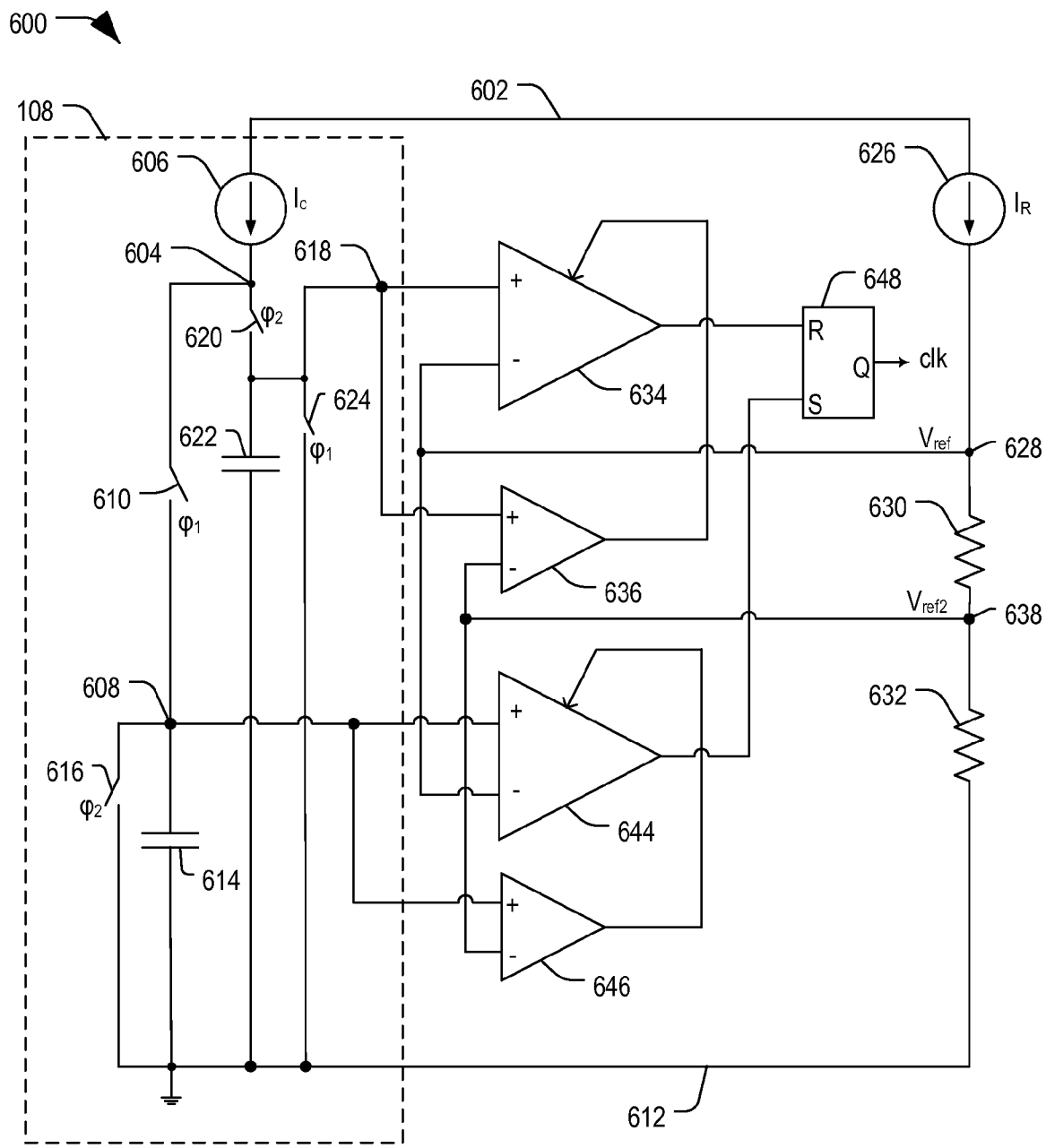
FIG. 6 is a diagram of a relaxation oscillator circuit including two comparators and two auxiliary comparators according to an embodiment.
Figure 7:
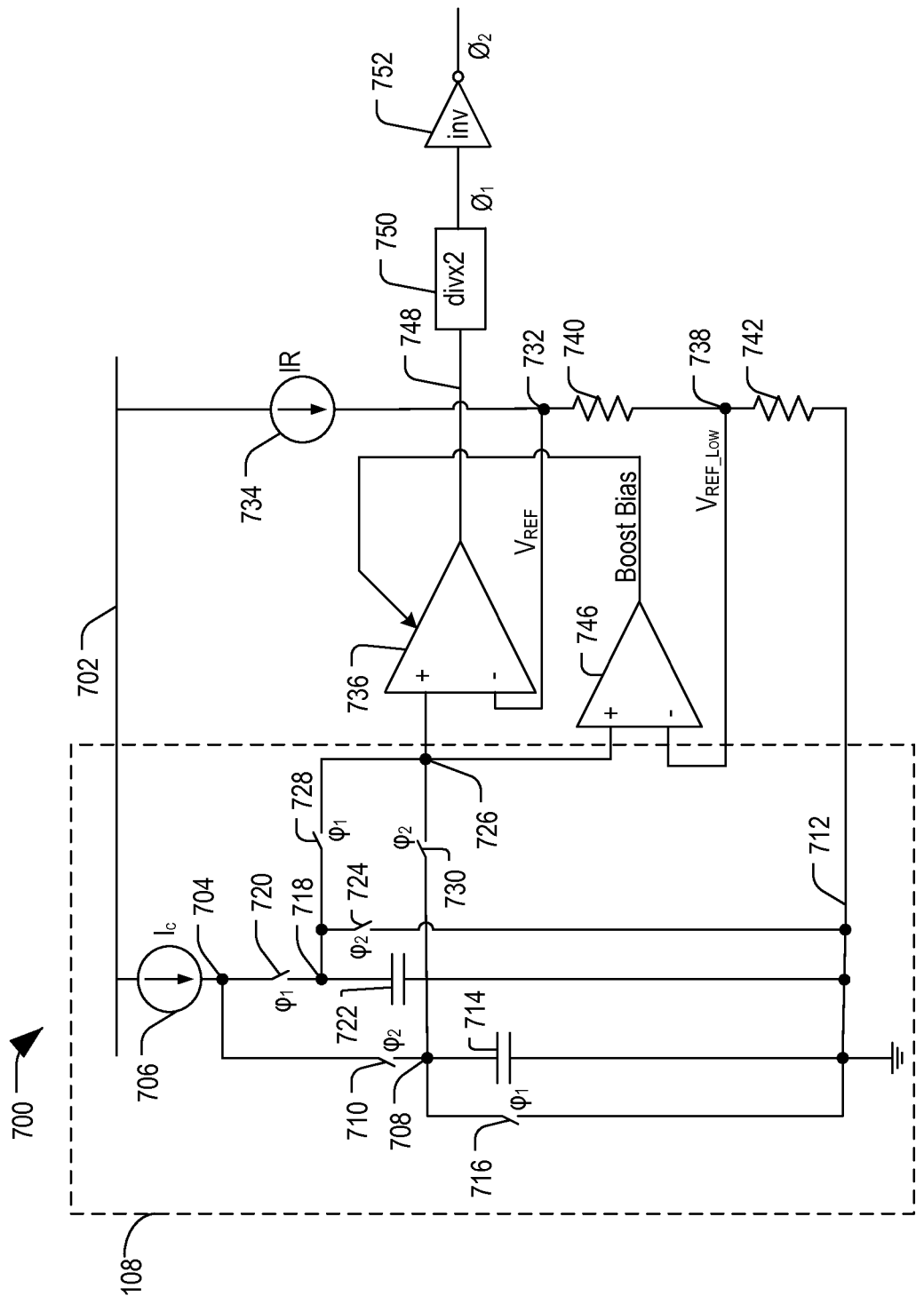
FIG. 7 is a diagram of a relaxation oscillator circuit including a single comparator and an auxiliary comparator according to an embodiment.

FIG. 6 is a diagram of a relaxation oscillator circuit 600 including two comparators 634 and 644 and two auxiliary comparators 636 and 646 according to an embodiment. Circuit 600 includes an embodiment of charging node infrastructure 108 that is coupled to comparators 634 and 644 and to auxiliary comparators 636 and 646.

Charging node infrastructure 108 includes a current source 606 coupled between a supply node 602 and a node 604 and configured to supply a charging current ($I_C$). Circuit 600 further includes a switch 610 coupled between node 604 and a node 608 and includes a capacitor 614 coupled between node 608 and a node 612. Further, circuit 600 includes a switch 616 coupled between nodes 608 and 612. Charging node infrastructure 108 further includes a switch 620 coupled between a node 604 and a node 618, and includes a capacitor 624 coupled between node 618 and node 612. Charging node infrastructure 108 also includes a switch 624 coupled between node 618 and node 612.

Relaxation oscillator circuit 600 further includes a reference voltage generation portion including a reference current source 626 coupled between node 602 and a node 628. Reference voltage generation portion further includes a resistor 630 coupled between a node 628 and a node 638 and includes a resistor 632 coupled between node 638 and node 612.

Comparator 634 includes a first input coupled to node 618, a second input coupled to node 628 and an output coupled to a reset input of an SR latch 602. Comparator 644 includes a first input coupled to node 608, a second input coupled to node 628, and an output coupled to the set input of SR latch 602. In the absence of auxiliary comparators 636 and 644, the period of oscillation (T) in Equation 2 would include a comparator delay for each of comparators 634 and 644. However, comparators 636 and 646 are configured to provide a boost bias signal to the power inputs of comparators 634 and 644, enhancing their speed and reducing the associated delay.

Auxiliary comparators 636 and 646 represent a boost bias circuit that may selectively adjust a voltage provided to the supply input of the comparators 634 and 644. Auxiliary comparator 636 includes a first input coupled to node 618, a second input coupled to node 638, and an output coupled to a supply input of comparator 634. Auxiliary comparator 646 includes a first input coupled to node 608, a second input coupled to node 638, and an output coupled to a supply input of comparator 644.

In an embodiment, during a first portion ($\phi_1$) of an oscillation period (T), switches 610 and 624 are closed, and switches 620 and 616 are open. Node 618 is coupled to ground through switch 624 and the node voltage at node 608 is increasing as capacitor 614 charges. When the node voltage at node 608 crosses the low reference voltage ($V_{REF\_Low}$) at node 638, auxiliary comparator 646 provides a boost bias to the bias input of comparator 644, putting comparator 644 into a high speed mode. When the node voltage at node 608 crosses the reference voltage ($V_{REF}$) at node 628, comparator 644 toggles and provides an output voltage ($V_{OUT}$) as a rising edge to the set input of RS latch 648, toggling the output of RS latch 648 to provide a clock signal (labeled "clk").

During the second portion ($\phi_2$) which may begin when comparator 644 supplies the output voltage signal to the set input of SR latch 648, circuit 600 closes switches 616 and 620 and opens switches 610 and 624, coupling node 608 to ground and discharging capacitor 614. During the second portion ($\phi_2$), capacitor 622 begins charging and the node voltage at node 618 increases. When the node voltage at node 618 crosses the low reference voltage ($V_{REF\_Low}$) at node 638, auxiliary comparator 636 provides a boost bias to the bias input of comparator 634, putting comparator 634 into a high speed mode. When the node voltage at node 618 crosses the reference voltage ($V_{REF}$) at node 628, comparator 634 toggles and provides an output voltage ($V_{OUT}$) as a rising edge to the reset input of RS latch 648, toggling the output of RS latch 648 to toggle the clock signal.

In an alternative embodiment, an additional RS latch may be included that includes a reset input coupled to the output of comparator 634, a set input coupled to the output of auxiliary comparator 636, and an output coupled to the bias input of comparator 634. Further, the output of comparator 634 may be coupled to the reset input of RS latch 648. Further, another RS latch may be included that has a reset input coupled to the output of comparator 644, a set input coupled to the output of auxiliary comparator 646, and an output coupled to the bias input of comparator 644. The output of comparator 644 may also be coupled to the set input of RS latch 648. This alternative embodiment may reduce power consumption of circuit 600 by shortening the time (width) of the boost bias pulse as discussed with respect to circuit 400 in FIG. 4.

While the relaxation oscillator circuit 600 of FIG. 6 includes two comparators and two auxiliary comparators, it is possible to implement the relaxation oscillator circuit using a single comparator and single auxiliary comparator with a switched configuration as described below with respect to FIG. 7. One example is described below with respect to FIG. 7.

FIG. 7 is a diagram of a relaxation oscillator circuit 700 including a single comparator 736 and an auxiliary comparator 746 according to an embodiment. Circuit 700 includes a charging current source 706 coupled between a supply node 702 and a node 704. Circuit 700 further includes a switch 710 coupled between node 704 and node 708 and includes a capacitor 714 coupled between node 708 and a node 712, which may be coupled to a power supply, such as ground. Circuit 700 includes a switch 716 coupled between node 708 and node 712. Circuit 700 further includes a switch 720 coupled between node 704 and node 718 and includes a capacitor 722 coupled between node 718 and node 712. Circuit 700 also includes a switch 724 coupled between node 718 and node 712.

Circuit 700 includes a reference current source 734 coupled between a supply node 702 and a node 732, and includes a resistor 740 coupled between node 732 and a node 738. Circuit 700 includes a resistor 742 coupled between node 738 and node 712.

Circuit 700 includes a switch 728 coupled between node 718 and node 726. Circuit 700 further includes a switch 730 coupled between node 708 and node 726. Comparator 736 includes a first input coupled to node 726, a second input coupled to node 732, and an output 748 coupled to a divide-by-two block 750. Divide-by-two block 750 includes an output to provide a clock signal (labeled "$\phi_1$") to an inverter 752, which has an output to provide an inverted clock signal (labeled "$\phi_2$"). Auxiliary comparator 746 includes a first input coupled to node 726, a second input coupled to node 738, and an output coupled to a supply input of comparator 736 to provide a boost bias signal.

In an embodiment, top plates of capacitors 714 and 722 selectively charge due to charging current ($I_C$) from current source 706, giving rise to two saw tooth voltage profiles which are out of phase. In an example, when the top plate voltage of capacitor 722 is low, the top plate voltage of capacitor 714 is being linearly ramped. Without auxiliary comparator 746, comparator 736 senses when the ramped voltage crosses the reference voltage ($V_{REF}$) and toggles high, enabling feedback which switches the positive input of comparator 736 to the top plate of capacitor 722. This pulls the input voltage at node 726 low. The output of comparator 736 is a pulsed signal with the pulse-width being equal to the speed of the oscillator feedback loop, dominated by the slow hi-low comparator transition.

However, auxiliary comparator 746 reacts to the rising node voltage on node 726 to produce the boost bias signal before the node voltage reaches the level of reference voltage $V_{REF}$. The boost bias signal places comparator 736 in a high speed mode, enabling comparator 736 to react quickly when the node voltage exceeds the reference voltage.

Figure 8:
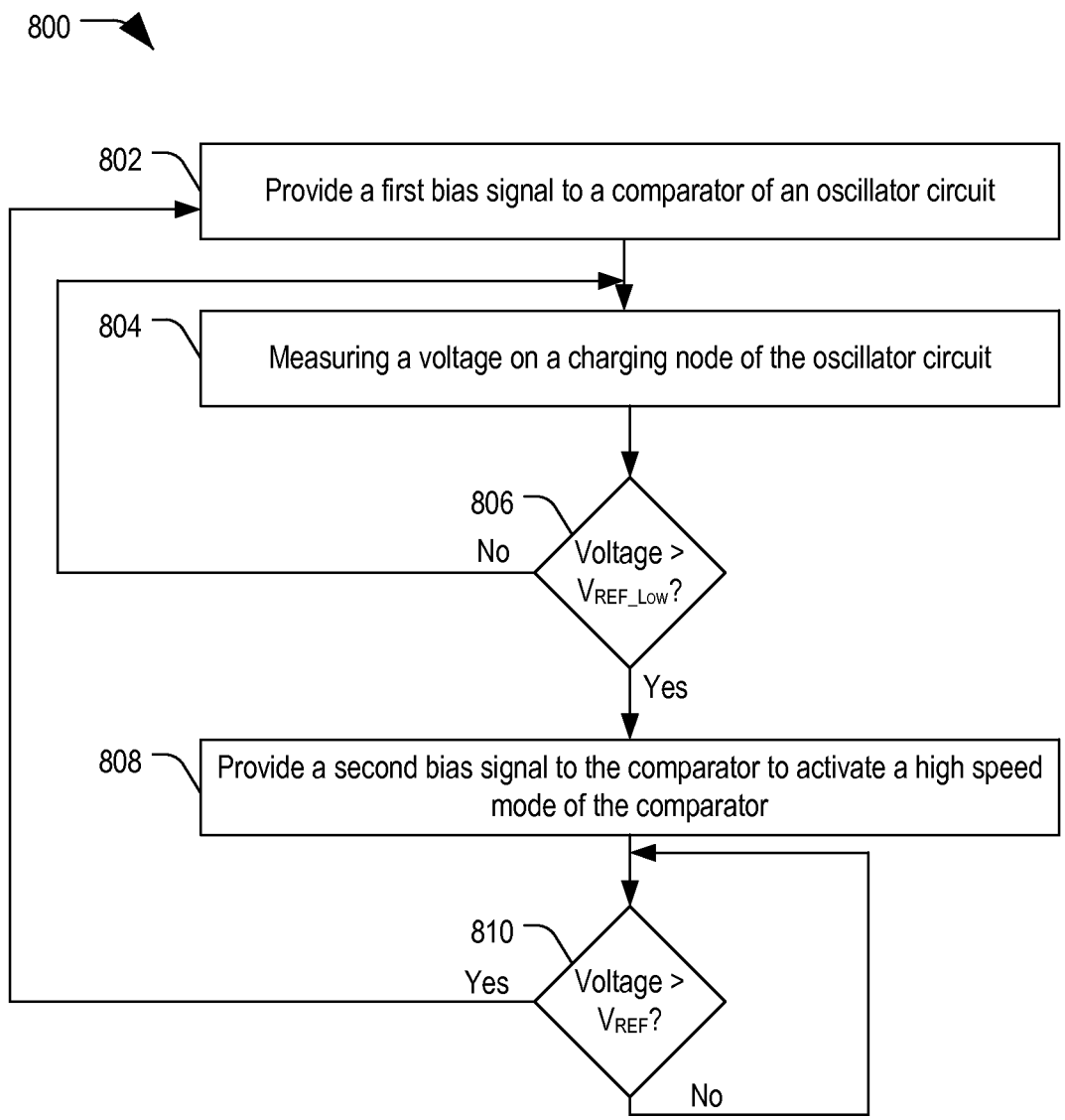
FIG. 8 is a flow diagram of a method of selectively increasing a bias provided to a comparator of a relaxation oscillator circuit according to an embodiment.

FIG. 8 is a flow diagram of a method 800 of selectively increasing a bias provided to a comparator of a relaxation oscillator circuit according to an embodiment. At 802, a first bias signal (current or voltage) is provided to a comparator of an oscillator circuit. In an embodiment, the first bias signal is a current signal that may be approximately 1.9 nA. Advancing to 804, a circuit measures a voltage on a charging node of the oscillator circuit. In an example, the circuit may be a comparator configured to compare the voltage on the charging node to a reference voltage.

Moving to 806, if the voltage is not greater than the low reference voltage ($V_{REF\_Low}$), the method 800 returns to 804 and the circuit continues to measure a voltage on a charging node of the oscillator circuit. If the voltage is greater than the low reference voltage ($V_{REF\_Low}$), the method 800 continues to 808 and a second bias signal (current or voltage) is provided to the comparator to activate a high speed mode of the comparator. In an embodiment, the second bias signal is a current signal that is approximately 100 nA.

Proceeding to 810, if the node voltage is not greater than the reference voltage ($V_{REF}$), the method 800 returns to 810 and continues to monitor the node voltage. If the node voltage is greater than the reference voltage ($V_{REF}$), the method 800 returns to 802 and the first operating current is again provided to a comparator of the oscillator circuit.

Although the present invention has been described with reference to preferred embodiments, workers skilled in the art will recognize that changes may be made in form and detail without departing from the scope of the invention.

What is claimed is:

1. A relaxation oscillator circuit comprising:
   a first comparator including a first input, a second input, a bias input, and an output, the first input coupled to a charging node, and the second input configured to receive a reference signal; and
   a first bias circuit configured to provide a bias signal to the bias input of the first comparator when a first node voltage on the charging node exceeds a first reference, the first bias circuit comprises a second comparator including:
     a first input coupled to the charging node;
     a second input configured to receive the first reference; and
     an output coupled to the bias input of the first comparator and configured to provide the bias signal.

2. The relaxation oscillator circuit of claim 1, wherein the first bias circuit comprises:
   a set-reset latch including a set input coupled to the output of the second comparator and including an output coupled to the bias input of the first comparator to receive the bias signal.

3. The relaxation oscillator circuit of claim 2, further comprising a switching network configured to selectively charge one of a first capacitor and a second capacitor and to selectively couple the one of the first and second capacitors to the charging node.

4. The relaxation oscillator circuit of claim 1, further comprising:
   a second bias circuit including configured to provide a second bias signal to the bias input of the second comparator when a second node voltage on a second charging node exceeds the first reference.

5. The relaxation oscillator circuit of claim 4, further comprising a set-reset latch including:
   a reset input coupled to the output of the first comparator;
   a set input coupled to the output of the second comparator; and
   an output configured to provide an output signal.

6. The relaxation oscillator circuit of claim 5, wherein the set-reset latch toggles from low-to-high in response to a voltage output signal on the output of the second comparator and toggles from high-to-low in response to a voltage output signal on the output of the first comparator.

7. The relaxation oscillator circuit of claim 1, further comprising a voltage divider circuit configured to provide the reference signal and the first reference.

8. A method of providing an oscillator signal having a period comprising a first portion and a second portion, the method comprising:
   receiving a first signal at a bias input of a first comparator of an oscillator circuit during the first portion of the period of the oscillator signal;
   comparing a node voltage to a first reference using a second comparator; and
   generating a bias signal at an output of the second comparator that is coupled to the bias input of the first comparator when the node voltage exceeds the first reference; and
   providing the bias signal tot the bias input during the second portion of the period of the oscillator signal.

9. The method of claim 8, further comprising:
   comparing, using the first comparator, the node voltage to a second reference voltage; and
   providing an output signal at an output of the first comparator when the node voltage exceeds the second reference voltage.

10. The method of claim 8, further comprising:
    providing a first signal to a first input of a set-reset latch when a node voltage of a charging node coupled to a first input of a second comparator exceeds a first reference; and
    providing a bias signal at an output of the set-reset latch that is coupled to the bias input of the first comparator in response to the first signal.

11. The method of claim 10, wherein providing the first signal comprises:
    receiving the node voltage at the first input of the second comparator;
    receiving the first reference at a second input of the second comparator; and
    providing the first signal at an output of the second comparator when the node voltage exceeds the first reference.

12. The method of claim 10, further comprising:
    providing a second signal at an output of the first comparator to a second input of the set-reset latch when the node voltage exceeds a second reference;
    toggling the output of the set-reset latch in response to the first signal and the second signal.

13. A relaxation oscillator circuit comprising:
    a first comparator including a first input, a second input, a bias input, and an output, the first input coupled to a first charging node, the second input coupled to a reference voltage, the bias input to receive a first bias signal during a first portion of a period of oscillation; and
    a first bias circuit coupled to the bias input and to the first charging node, the first bias circuit configured to provide a second bias signal to the bias input during a second portion of the period of oscillation, the first bias circuit comprising a second comparator including:
      a first input coupled to a second charging node;
      a second input coupled to a first reference; and
      an output coupled to the bias input to provide the second bias signal.

14. The relaxation oscillator circuit of claim 13, wherein:
    a node voltage on the first charging node is less than the first reference during the first portion of the period of oscillation; and
    the node voltage is greater than the first reference during the second portion.

15. The relaxation oscillator circuit of claim 13, wherein:
the second comparator further is further configured to provide a signal when a node voltage on the first charging node exceeds the first reference; and
the first bias circuit further comprises:
a set-reset latch including a first input coupled to the output of the second comparator, and including a second input coupled to the output of the first comparator, the set-reset latch further including an output coupled to the bias input of the first comparator to selectively provide one of the first bias signal and the second bias signal.

16. The relaxation oscillator circuit of claim 13, further comprising:
the second comparator further including a bias input; and
a second bias circuit coupled to the bias input of the second comparator and to the second charging node, the second bias circuit configured to provide a second bias signal to the bias input of the second comparator when a second node voltage on the second charging node exceeds the first reference.

17. The relaxation oscillator circuit of claim 16, further comprising a set-reset latch including a first input, a second input, and an output, the first input coupled to the output of the second comparator, the second input coupled to the output of the first comparator, and the output to provide a clock signal.

18. The relaxation oscillator circuit of claim 13, wherein the second bias signal increases a speed of a response time of the first comparator.

* * * * *